United States Patent
Crimmins et al.

(10) Patent No.: US 9,847,750 B2
(45) Date of Patent: Dec. 19, 2017

(54) COAXIAL DRIVE TRACKING SYSTEM FOR USE WITH PHOTOVOLTAIC SYSTEMS

(71) Applicant: BRIGHTLEAF TECHNOLOGIES INC., Montrose, CO (US)

(72) Inventors: James P. Crimmins, Placerville, CO (US); Peter Young, San Francisco, CA (US); Douglas Kiesewetter, Montrose, CO (US)

(73) Assignee: BrightLeaf Technologies, Inc., Montrose, CO (US)

( * ) Notice: Subject to any disclaimer, the term of this patent is extended or adjusted under 35 U.S.C. 154(b) by 0 days.

(21) Appl. No.: 14/966,218

(22) Filed: Dec. 11, 2015

(65) Prior Publication Data
US 2016/0164454 A1    Jun. 9, 2016

Related U.S. Application Data

(62) Division of application No. 13/827,773, filed on Mar. 14, 2013, now Pat. No. 9,224,898.

(51) Int. Cl.
*H01L 31/044* (2014.01)
*H02S 20/32* (2014.01)
(Continued)

(52) U.S. Cl.
CPC ............. *H02S 20/32* (2014.12); *F24J 2/5233* (2013.01); *F24J 2/542* (2013.01); *H01L 31/052* (2013.01);
(Continued)

(58) Field of Classification Search
CPC ....... H01L 31/00–31/078; Y02E 10/50–10/60; H02S 20/30–20/32;
(Continued)

(56) References Cited

U.S. PATENT DOCUMENTS

2008/0282828 A1* 11/2008 Jones .................. H02S 20/30
                                                          74/471 R
2009/0194145 A1*  8/2009 Kribus ................... F24J 2/12
                                                          136/248
(Continued)

FOREIGN PATENT DOCUMENTS

EP           2012366 A2    1/2009
JP        2002-081763 A    3/2002
(Continued)

OTHER PUBLICATIONS

International Preliminary Report on Patentability (PCT/US2011/056114), dated Apr. 16, 2013.

*Primary Examiner* — Bach Dinh
(74) *Attorney, Agent, or Firm* — Bracewell LLP; Keith R. Derrington

(57) ABSTRACT

A solar energy collection system for converting solar energy to electricity that includes solar arrays mounted on a frame. Each array is set on a tracker head that is supported on a pedestal; each pedestal mounts onto a beam. Elevators pivot the arrays, where each elevator is made up of a shaft with a threaded end coupled to a drive nut. An upper end of each drive nut gimbal mounts to a portion of the tracker head; rotating a lower end of each shaft raises or lowers the drive nut, thereby pivoting each array. The vertical shafts are ganged together and driven by a single motor. Further included with each pedestal are azimuth orientation shafts that also mount to each tracker head. Rotating each orientation shaft adjusts an azimuth of an associated array. The orientation shafts are ganged together and are rotated by a single motor.

10 Claims, 4 Drawing Sheets

(51) Int. Cl.
  *H01L 31/052* (2014.01)
  *F24J 2/52* (2006.01)
  *F24J 2/54* (2006.01)
  *H02S 20/00* (2014.01)
  *H02S 40/22* (2014.01)
  *H02S 30/10* (2014.01)
  *H02S 20/10* (2014.01)
  *H02S 20/22* (2014.01)

(52) U.S. Cl.
  CPC .............. *H02S 20/00* (2013.01); *H02S 20/10* (2014.12); *H02S 20/22* (2014.12); *H02S 30/10* (2014.12); *H02S 40/22* (2014.12); *F24J 2002/5458* (2013.01); *F24J 2002/5468* (2013.01); *F24J 2002/5486* (2013.01); *Y02B 10/10* (2013.01); *Y02E 10/47* (2013.01); *Y02E 10/52* (2013.01)

(58) Field of Classification Search
  CPC ................ F24J 2/38; F24J 2/54–2/5431; F24J 2002/385; F24J 2002/5434–2002/5496
  USPC .................................................. 136/243–265
  See application file for complete search history.

(56) References Cited

U.S. PATENT DOCUMENTS

| | | |
|---|---|---|
| 2009/0223509 A1 | 9/2009 | Hoellenriegel |
| 2010/0193013 A1* | 8/2010 | Kong .................... F24J 2/5427 136/251 |
| 2011/0079214 A1 | 4/2011 | Hon |

FOREIGN PATENT DOCUMENTS

| | | |
|---|---|---|
| KR | 10-2010-0066745 A | 6/2010 |
| KR | 10-0968751 B1 | 7/2010 |

\* cited by examiner

COAXIAL DRIVE TRACKING SYSTEM FOR USE WITH PHOTOVOLTAIC SYSTEMS

CROSS REFERENCE TO RELATED APPLICATIONS

This application is a divisional of, and claims priority to and the benefit of, co-pending U.S. patent application Ser. No. 13/827,773, filed Mar. 14, 2013, which claimed priority to and the benefit of U.S. Provisional Application Ser. No. 61/621,840; filed Apr. 9, 2012, the full disclosure of which are hereby incorporated by reference herein for all purposes.

BACKGROUND

1. Field of Invention

The invention relates generally to a drive system for aligning photovoltaic cells. More specifically, the invention concerns aligning photovoltaic cells mounted on multiple pedestals with a single drive system.

2. Description of Prior Art

Converting solar energy into electricity is often accomplished by directing the solar energy onto one or more photovoltaic cells. The photovoltaic cells are typically made from semiconductors that can absorb energy from photons from the solar energy, and in turn generate electron flow within the cell. A solar panel is a group of these cells that are electrically connected and packaged so an array of panels can be produced; which is typically referred to as a flat panel system. Solar arrays are typically disposed so they receive rays of light directly from the source.

Some solar collection systems concentrate solar energy by employing curved solar collectors that concentrate light onto a solar cell. The collectors are often parabolic having a concave side and a convex side, where the concave side typically faces towards the sun and reflects sunlight onto a strategically positioned receiver. Receivers for use with concentrated solar energy are generally equipped with a photovoltaic cell that has a higher performance than those in flat panel systems. The concave configuration of the reflective surface converges reflected rays of solar energy to concentrate the rays when contacting the receiver. Concentrating the solar energy with the curved collectors can project up to about 1500 times the intensity of sunlight onto a receiver over that of a flat panel system. As the cells currently do not convert all the solar energy received into electricity, substantial heating occurs on the receiver that can damage the cells unless the thermal energy accumulated on the receiver can be transferred elsewhere.

Solar collection systems that concentrate solar energy generally employ a number of collectors; each having a reflective side configured to focus the reflected light onto a solar receiver. Because the solar energy is concentrated, the reflective surface area exceeds the conversion cell area by a significant amount. Solar collection and conversion systems often consolidate the collectors into a solar array, thereby boosting the electricity generating capacity of the conversion system. The collectors within an array are typically positioned within a localized area to minimize the total area of the array.

SUMMARY OF THE INVENTION

Disclosed herein are systems and methods for collecting solar energy which is converted into electricity. In one example provided herein is a solar energy collection system which includes a frame having an elongate beam, elongate pedestals each having an end coupled with the beam, a solar array pivotingly mounted on an end of each pedestal distal from the beam, an inclination assembly in each pedestal having a portion in contact with the array on the pedestal. The inclination assembly is selectively elevated to a range of distances above the pedestal, so that when the portion is elevated an inclination of the array changes. Also included in each pedestal is an azimuth assembly that couples with the array on the pedestal, and that is rotatable about an axis of the pedestal. An inclination linkage, with a portion disposed in the beam, couples the inclination assembly to an inclination motor. Similarly, an azimuth linkage, with a portion disposed in the beam, couples the azimuth assembly to an azimuth motor. In an example, the inclination assemblies each include a shaft, a nut threadingly engaged with an upper end of the shaft proximate the solar array, a lower end of the shaft projecting into the beam, and a pulley on a lower end of the shaft. In this example, the inclination linkage includes a belt that engages a pulley on the inclination motor and also engages the pulley on the lower end of each shaft. The azimuth assembly can have a tubular member in each pedestal that circumscribes a portion of an inclination assembly, an upper end coupled with a solar array, a lower end in the beam, a pulley on the lower end. In this example, the azimuth linkage includes a belt that engages a pulley on the azimuth motor and also engages the pulley on the lower end of each tubular member. The system can further optionally include a multiplicity of beams with pedestals, solar arrays on the pedestals, in each pedestal an inclination assembly and an azimuth assembly, an inclination linkage and an azimuth linkage in each beam, an inclination motor coupled to each inclination linkage, and an azimuth motor coupled to each azimuth linkage. This example can further have cross members coupling together the beams to define a self-supporting structure for supporting the solar arrays. An electrical circuit can optionally be included that is connected to the solar array and that includes a load powered by electricity generated by the solar array. In an example, the solar array has solar collectors, and a receiver strategically disposed away from each solar collector, so that when solar energy reflects from a collector, an image is formed on a receiver that is converted into electricity in the receiver.

Also disclosed herein is a solar energy collection system which includes an array of solar collectors pivotingly mounted on a support frame. An inclination assembly is provided in the support frame and has a portion selectively disposed along a range of elevations that is coupled with the array, so that when an elevation of the portion changes, an inclination of the array is changed. Further included is an azimuth assembly coupled with the array, the azimuth assembly is coaxially disposed within the support frame and rotatable about an axis of the azimuth assembly, so that when the azimuth assembly rotates, an azimuth of the array is changed. The system also includes an inclination motor coupled with the inclination assembly and an azimuth motor coupled with the azimuth assembly. In this example, the support frame can also have a pedestal having a lower end that mounts in an elongate beam and an upper end coupled with the solar array. Optionally, multiple pedestals can be mounted on the frame, where each pedestal has a solar array, an inclination assembly, and an azimuth assembly, and which defines a solar unit. In an example, multiple solar units can be arranged in rows and coupled together by cross members. In an example, each solar unit has a single inclination motor and a single azimuth motor.

A method of converting solar energy to electricity is provided herein, and that in one example includes providing a solar energy collection system with solar arrays mounted on a frame, an azimuth positioning system, and an inclination positioning system and transporting the solar energy collection system to a designated location having a mounting surface. The frame is set on a mounting surface, and the azimuth positioning system and the inclination positioning system are activated. The solar arrays are oriented in a designated orientation with the azimuth positioning system and the inclination positioning system and solar energy is reflected from solar collectors to receivers in the solar arrays that generate electricity in response to exposure to solar energy. The designated orientation can be an orientation wherein the solar collectors receive a maximum amount of solar energy. The method can further include reorienting the solar arrays in response to a change in a relative position of the sun.

BRIEF DESCRIPTION OF THE DRAWINGS

Some of the features and benefits of the present invention having been stated, others will become apparent as the description proceeds when taken in conjunction with the accompanying drawings, in which.

Figure 1:
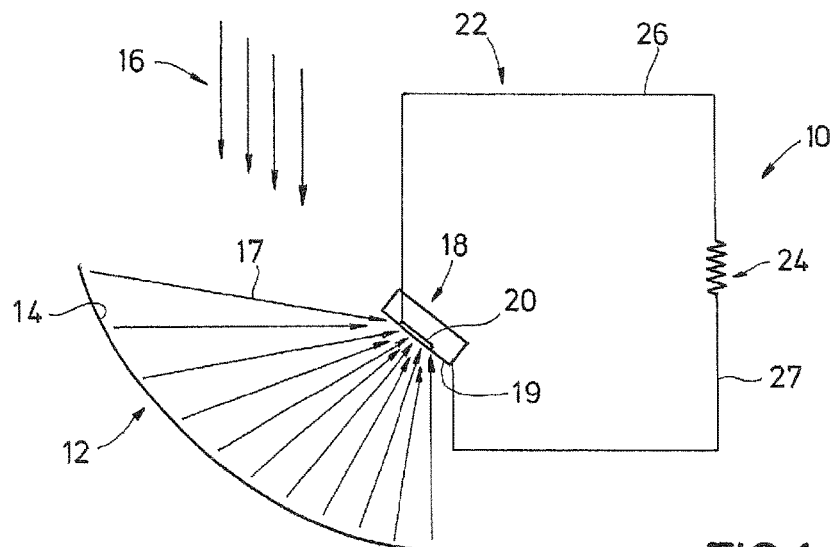
FIG. 1 is a schematic view of an example embodiment of a solar energy system in accordance with the present invention.

While the invention will be described in connection with the preferred embodiments, it will be understood that it is not intended to limit the invention to that embodiment. On the contrary, it is intended to cover all alternatives, modifications, and equivalents, as may be included within the spirit and scope of the invention as defined by the appended claims.

DETAILED DESCRIPTION OF INVENTION

The method and system of the present disclosure will now be described more fully hereinafter with reference to the accompanying drawings in which embodiments are shown. The method and system of the present disclosure may be in many different forms and should not be construed as limited to the illustrated embodiments set forth herein; rather, these embodiments are provided so that this disclosure will be thorough and complete, and will fully convey its scope to those skilled in the art. Like numbers refer to like elements throughout.

It is to be further understood that the scope of the present disclosure is not limited to the exact details of construction, operation, exact materials, or embodiments shown and described, as modifications and equivalents will be apparent to one skilled in the art. In the drawings and specification, there have been disclosed illustrative embodiments and, although specific terms are employed, they are used in a generic and descriptive sense only and not for the purpose of limitation. Accordingly, the improvements herein described are therefore to be limited only by the scope of the appended claims.

FIG. 1 provides in schematic view an example embodiment of a solar energy collection system 10 having a curved collector 12 and a reflective surface 14 on a concave side of the collector 12. In one example embodiment the collector 12 has a parabolic shape. In the example of FIG. 1, the collector 12 is disposed in the path of solar rays 16 that strike the reflective surface 14 and are redirected as reflected rays 17. The reflected rays 17 are shown traveling on a path towards a solar receiver 18 shown spaced back from the reflective surface 14. The collector 12 is shaped and contoured so that the reflective rays 17 form a defined image 19. In the example of FIG. 1, a photovoltaic cell 20 is shown on the receiver 18 that coincides with formation of the image 19. The image 19 has an area or footprint that is smaller than that of the reflective surface 14, but its flux density more concentrated than that of the solar rays 16. The photovoltaic cell 20 converts the concentrated energy in the image 19 into electrical current that flows into a circuit 22 shown connected to the photovoltaic cell 20. Further illustrated in the example of FIG. 1, is an electrical load 24 schematically represented within the circuit 22. Electrical lines 26, 27 provide electrical communication between the photovoltaic cell 20 and load 24, thereby completing the circuit 22.

Figure 2:
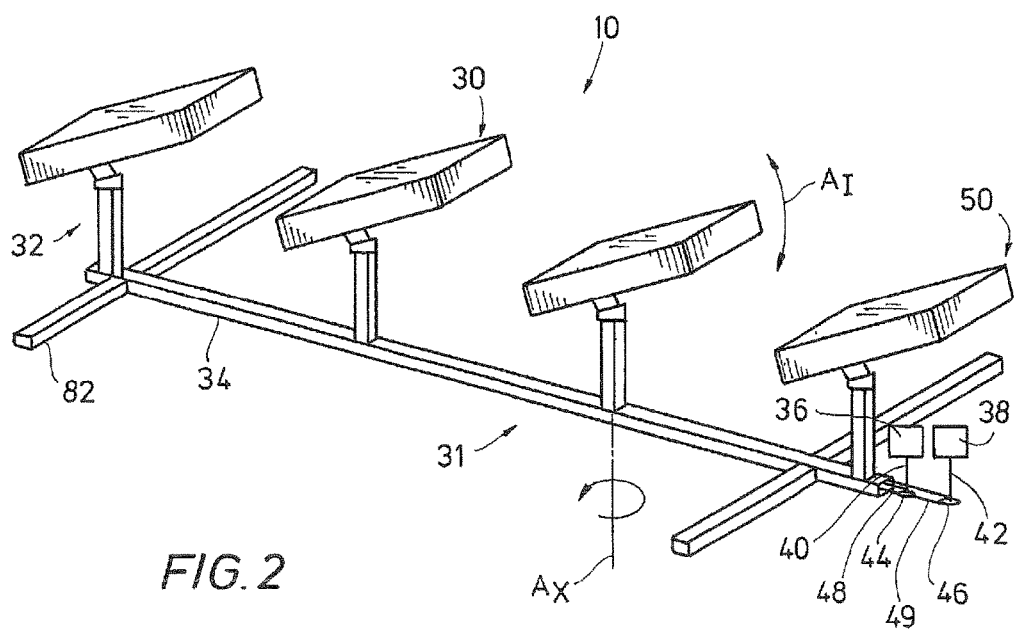
FIG. 2 is a side perspective view of an example of an array of FIG. 1 coupled with a drive system in accordance with the present invention.

An example embodiment of arrays 30 of a solar energy collection system 10 (FIG. 1) are provided in a perspective view in FIG. 2. In this example, each of the arrays 30 are mounted on a tracker system 31 for selectively adjusting the azimuth and inclination of each array 30. The embodiment of the tracker system 31 of FIG. 1 includes pedestal assemblies 32 on which each of the arrays 30 are mounted. Each example pedestal assembly 32 is shown as a generally elongate vertical member whose lower end mounts on an elongate and longitudinally oriented beam 34. In the example of FIG. 2, the beam 34 is a generally hollow member with a rectangle like cross section. As will be described in more detail below, an inclination linkage couples an inclination assembly in each pedestal assembly 32 with an inclination motor 36. Inclination motor 36 is schematically illustrated disposed adjacent an end of the beam 34, and provides a motive means for adjusting the inclination of the arrays 30. Similarly, azimuth linkages couple azimuth assemblies in each pedestal assembly 32 with a schematically illustrated motor 38 for adjusting the azimuth of each of the arrays 30. Shafts 40, 42 provide rotational output respectfully from motors 36, 38 to pulleys 44, 46. The pulleys 44, 46, engage belts 48, 49 that extend within the beam 34 for transmitting rotational force from the motors 36, 38 to the linkages. In the example of FIG. 2, the row of arrays 30 mounted on pedestals 32 projecting from the beam 34 define a solar unit 50.

Figure 3:
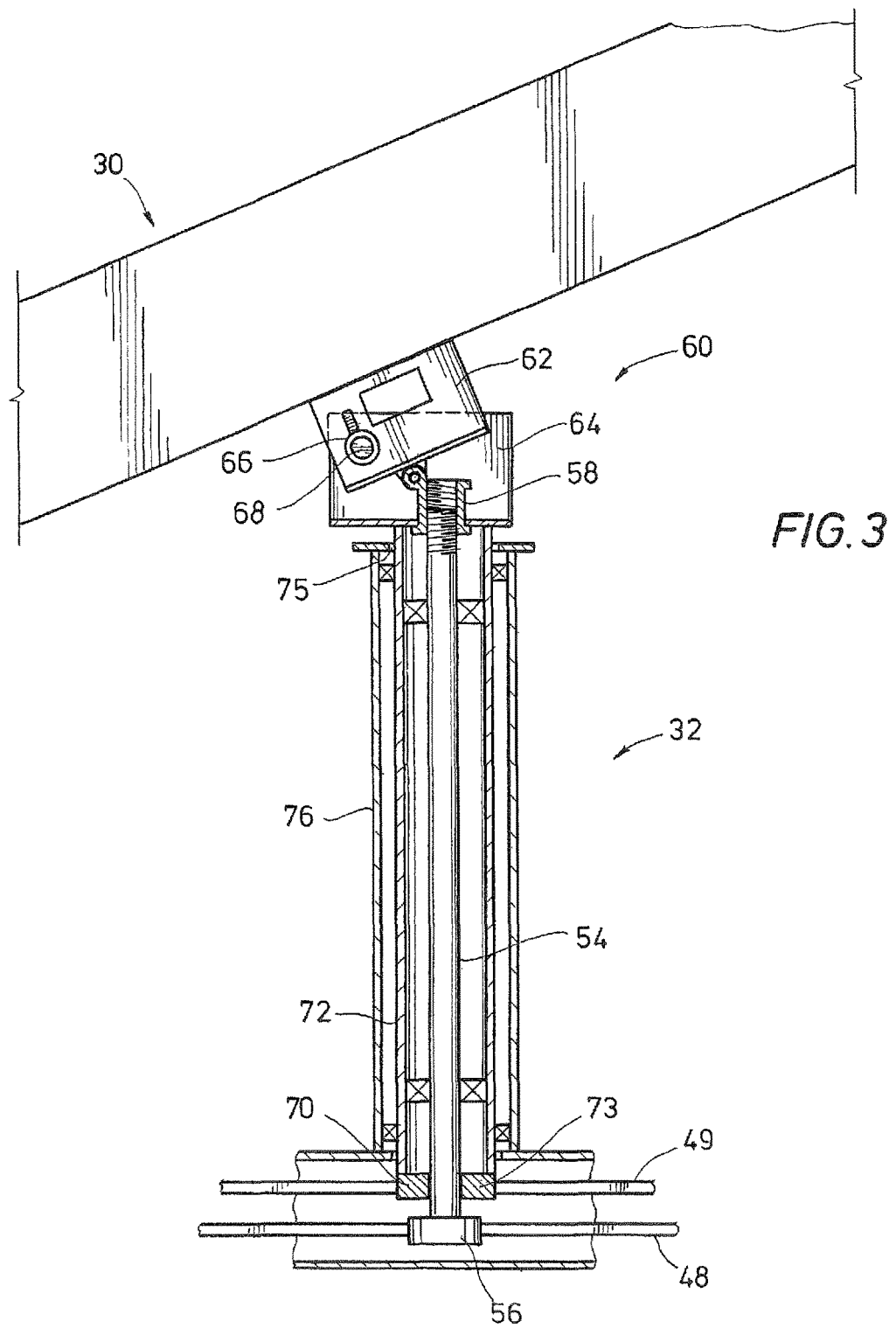
FIG. 3 is a side sectional view of a portion of the array and drive system of FIG. 2 in accordance with the present invention.

Referring now to FIG. 3, an example of a pedestal 32 is provided in a side sectional view and which shows an inclination assembly 52 therein. In the illustrated embodiment, the inclination assembly 52 includes an elongate shaft 54. Linkage assembly 55 for coupling inclination assembly 52 with inclination motor 36 includes belt 48 which engages a pulley 56 shown coaxially coupled on an end of the shaft 54. Thus, as illustrated by the directional arrows, longitudinally moving belt 48 rotates pulley 56, which in turn rotates shaft 54. In the example of FIG. 3, the pulley 56 has a diameter that exceeds a diameter of the shaft 54. A nut 58 is illustrated threadingly engaged with a threaded end of the shaft 54 distal from the pulley 56; where the shaft 54 is rotatable with respect to the nut 58. Adjacent the nut 58 is a tracker head 60 shown coupled with a lower surface of an array 30. The example of the tracker head 60 of FIG. 3 includes a pivot member 62 and an azimuth plate 64. In this example, both the pivot member 62 and azimuth plate 64 have a planar mid-section, with planar end portions that project substantially perpendicular from opposing ends of the mid-section. Thus both member 62 and plate 64 have generally "U" shaped cross sections. The distance between the inside of the end portions of the azimuth plate 64 exceeds the distance between the outside of the end portions of the pivot member 62. The difference in distances allows the pivot member 62 to be positioned between the end portions of the azimuth plate 64. A tubular hinge member 66 extends between end portions of the pivot member 62. A pin 68, which extends between opposing end portions of the azimuth plate 64, inserts into the hinge member 66. Thus pivotingly mounting the pivot member 62 between vertical portions of the azimuth plate 64. Further in the example of FIG. 3, the hinge member 66 is offset from the middle of the mid-section.

The embodiment of the pedestal 32 of FIG. 3 further includes a tubular azimuth drive assembly 70 shown having a cylinder 72 circumscribing the shaft 54. Upper end of cylinder 72 connects to nut 58, and a pulley 73 attaches to a lower end of cylinder 72; where pulley 73 is substantially coaxial with pulley 56. Pulley 73 and belt 49 form an azimuth linkage assembly 74 which couples azimuth drive assembly 70 to azimuth motor 38. Distal from the pulley 73, the cylinder 72 inserts into a bore 75 formed axially through a horizontal portion of the azimuth plate 64. The bore 75 in the mid-section of the azimuth plate 64 provides for passage of the shaft 54 therethrough. A tubular pedestal piling 76 circumscribes the cylinder 72 and provides structural support for the elevator assembly 58 and azimuth drive member 70. Although cut away for clarity in the example of FIG. 3, piling 76 also circumscribes pulley 56 and its lower end couples to beam 34 (FIG. 2).

Still referring to FIG. 3, upper ends of the vertical portions of the pivot member 62 are in contact with a lower end of the array 30; and an upper surface of the nut 58 contacts a lower surface of the pivot member 62. Embodiments exist wherein the nut 58 is coupled with one of the pivot member 62 or azimuth plate 64. So instead of rotating with rotation of the shaft 54, by virtue of its threaded engagement with shaft 54, the nut 58 is urged in a direction axially with the shaft 54. Thus rotating the elevator assembly 58 vertically displaces the nut 58 with respect to the azimuth plate to exert a vertical force onto the pivot member 62 and changes an inclination of the array 30. Depending on the rotational direction of the elevator assembly 58; the pivot member 62 pivots upward or downward. By rotating the cylinder 72, the attached azimuth plate 64 is also rotated. As the azimuth plate 64 rotates, so do the pivot member 62 and array 30, due to the respective couplings between these members. Thus rotating the azimuth plate 64 in turn changes the azimuth of the array 30. Accordingly, the inclination and/or azimuth of the array 30 can be adjusted by respectively rotating the elevator assembly 52 and azimuth drive assembly 70.

Figure 4:
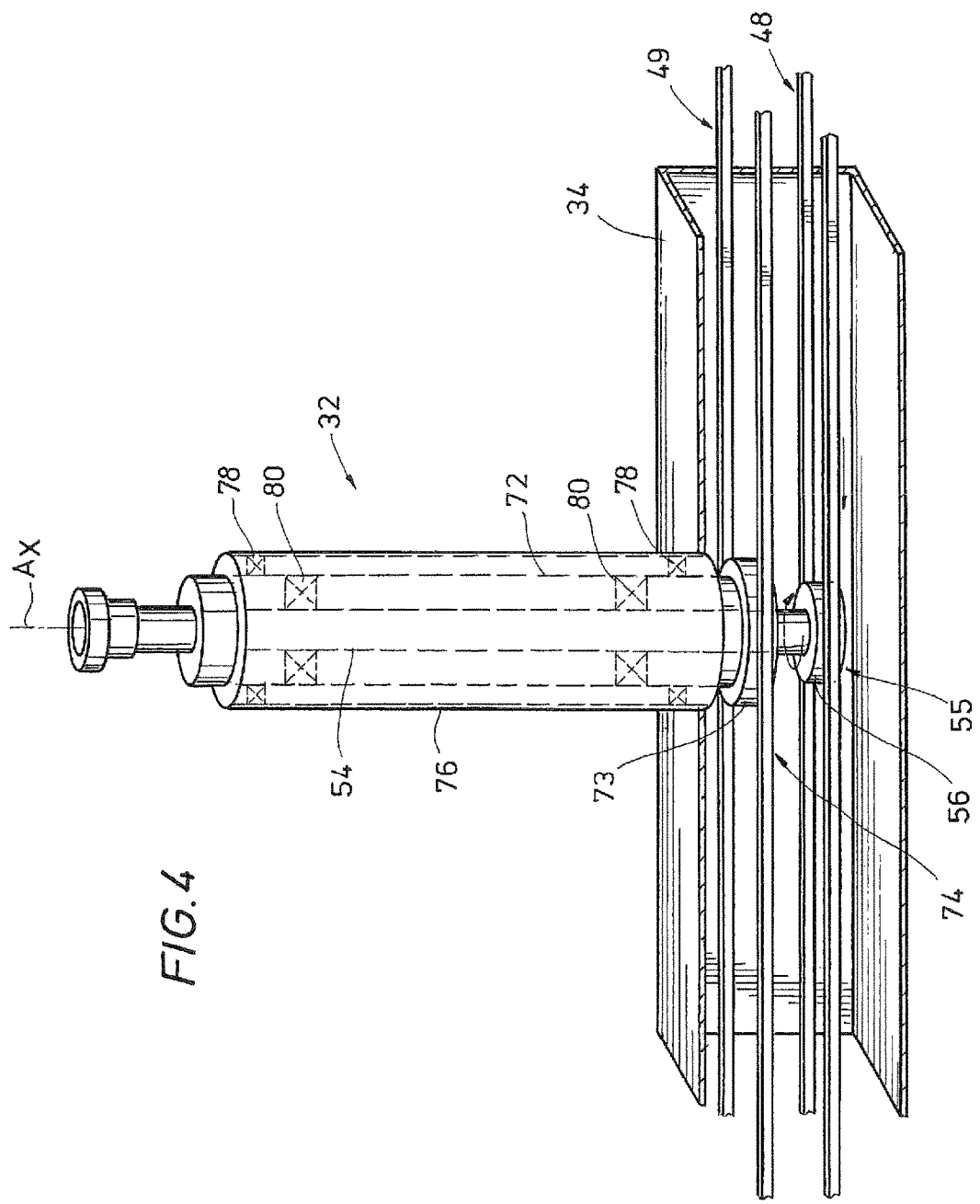
FIG. 4 is a partial sectional and perspective view of an example of a portion of the drive system of FIG. 2 in accordance with the present invention.

Schematically illustrated in a partial sectional view in FIG. 4 is an example of one of the pedestal assemblies 32 that mount to the beam 34 (FIG. 2). In the example shown, a lower end of the pedestal piling 76 inserts into an upper surface of the beam 34 and mounts thereon. Also in the embodiment of FIG. 4, shaft 54 and cylinder 72 are substantially coaxial with an axis $A_X$ of piling 76. Further shown is that the pulley 56 couples with belt 48. In this example, the belt 48 extends substantially the length of beam 34 (FIG. 2) and is positioned to engage pulleys (not shown) of all pedestal assemblies 32 (FIG. 2). Accordingly, all pulleys 56 that are part of an inclination linkage assembly 51 (FIG. 3) are selectively rotatable by operation of the same motor 36. Also, pulleys 74 of each of the pedestal assemblies 32 couple with belt 49 so that they are selectively rotatable by operation of motor 38. Thus the inclination and azimuth of multiple arrays 30 can be selectively positioned by motors 36, 38; wherein in an example, all arrays 30 can be simultaneously positioned by motors 36, 38. Further illustrated in FIG. 4 are bearings 78 disposed between the pedestal piling 76 and the cylinder 72 so the piling 76 can provide vertical support for the cylinder 72 without introducing an interfering amount of friction. Similarly, bearings 80 are shown optionally provided between the shaft 54 and the cylinder 72.

Designated or desired azimuths and inclinations of the arrays 30 can be based on an orientation that results in a maximum amount of electricity delivered to circuit 22 (FIG. 1). Tracking systems can be relied on for estimating a designated orientation, and a controller for directing operation of the motors 36, 38 so that the designated orientation of the arrays 30 is achieved. In an example of operation, as the path of the sun rays changes relative to the arrays 30, so does the designated orientation. When the tracking system recognizes that a difference between the orientation of the arrays 30 and a designated orientation exceeds a designated threshold, the motors 36, 38 can be operated so that the orientation of the arrays 30 is substantially equal to or within an operational tolerance of the designated orientation.

Figure 5:
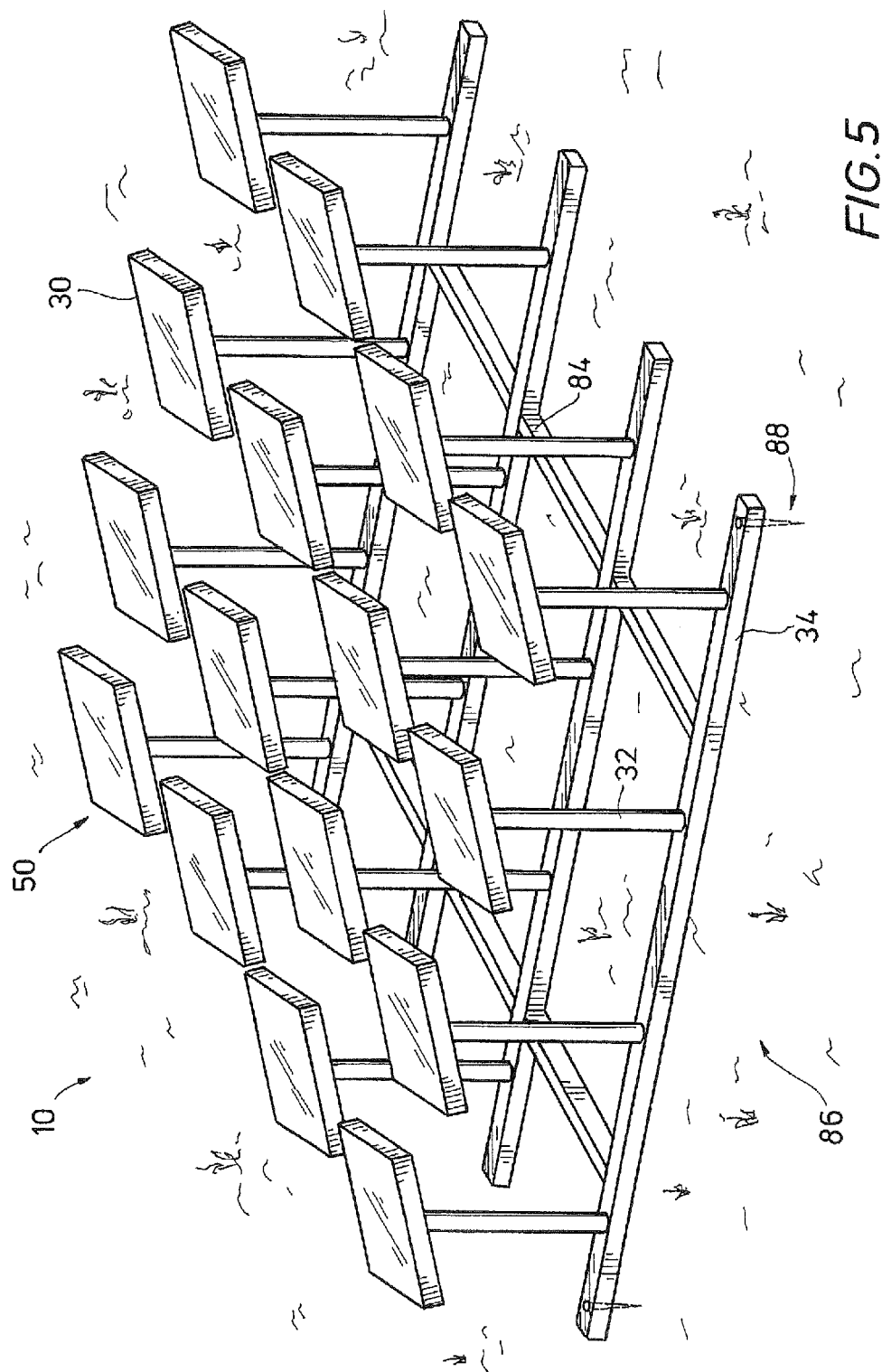
FIG. 5 is a perspective view of an alternate embodiment of the solar energy system of FIG. 1 and in accordance with the present invention.

A significant weight and cost advantage is realized by orienting multiple arrays 30 with motors 36, 38, rather than a motor or motors required for each array. Additionally, because the "ganged" arrays 30 are secured on the pedestals 32 and beam 34, the need to build a support at the installation site is eliminated. Optionally, elongate stabilizer beams 82 (FIG. 2) can be included with the system 10 that connect to the beam 34 and project laterally therefrom to maintain a vertical orientation of the pedestal assemblies 32. In another example embodiment provided in FIG. 5, multiple solar units 50 of arrays 30, pedestal assemblies 32 and beams 34 can be connected together by cross members 84. In this example, the solar units 50 are arranged substantially parallel with one another, with the cross members 84 perpendicular to the beams 34. Other arrangements of structure are available that form a modular system 10, such as the cross members 84 being at oblique angles to the beams 34. Optionally, embodiments of the system 10 include any number of rows of solar units 50, wherein each unit 50 can have any number of arrays 30. A self-supporting structure is thereby created that is mobile, and can be readily deployed without fabricating a foundation or coupling to an underlying surface.

In one example of operation, one or more rows of solar units 50 are provided to form a system 10, where the system 10 is self-supporting with array 30 stable on its associated pedestal 32. Additionally, the self-supporting system 10 is modular and can be substantially fabricated before being transported to a designated location for its use. At the designated location, the system 10 can be set on a mounting surface 86. Example mounting surfaces 86 include the ground, another structure (e.g. building, house, decking, etc.), or a support slab. Fasteners 88 schematically shown through the beam 34 can be used to anchor the system 10 depending on the location and conditions of use. The arrays 30 can be oriented to collect a maximum amount of solar energy by actuating the motors 36, 38; which drives the inclination and azimuth assemblies 52, 70 (FIG. 3) to position the arrays 30. Various sun acquisition techniques can be employed to determine the designated orientation of the arrays 30. Moreover, tracking techniques are available for reorienting the orientation of the arrays 30 to track movement of the sun.

The present invention described herein, therefore, is well adapted to carry out the objects and attain the ends and advantages mentioned, as well as others inherent therein. While a presently preferred embodiment of the invention has been given for purposes of disclosure, numerous changes exist in the details of procedures for accomplishing the desired results. For example, multiple rails can be ganged together so that the arrays mounted on each rail can be tilted with actuation of a single motor and/or rotated with a single motor. Optionally, rack and pinion components, or the like, may be used in lieu of the belts 48, 49 and pulleys 56, 74. Further, the system and method described herein for orienting an array of solar collectors can apply to flat panel photovoltaic cells, low concentration CPV, CSP (heliostats), high concentration photovoltaic cells, and combinations thereof. These and other similar modifications will readily suggest themselves to those skilled in the art, and are intended to be encompassed within the spirit of the present invention disclosed herein and the scope of the appended claims.

The invention claimed is:

1. A method of converting solar energy to electricity comprising:
    collecting solar energy with a solar energy collection system that comprises solar arrays mounted on a frame, an azimuth positioning system coupled with the solar arrays, an inclination positioning system coupled with the solar arrays, an azimuth motor coupled with the azimuth positioning system via an azimuth linkage assembly, and an inclination motor coupled with the inclination positioning system via an inclination linkage assembly;
    rotating the arrays about a vertical axis to orient the solar arrays in a designated azimuthal orientation by energizing the azimuth motor so that a force is transmitted to the azimuth positioning system via the azimuth linkage assembly linkage assembly:
    rotating the arrays about a horizontal axis to orient the solar arrays in a designated inclination orientation by energizing the inclination motor so that a force is transmitted to the inclination positioning system via the inclination linkage assembly;
    reflecting solar energy from solar collectors to receivers in the solar arrays that generate electricity in response to exposure to solar energy; and
    wherein the azimuth and inclination linkage assemblies each comprises belts, and wherein the motors provide a rotational force to the belts that drive the azimuth and inclination positioning systems.

2. The method of claim 1, wherein the designated orientation is an orientation that the solar collectors receive a maximum amount of solar energy.

3. The method of claim 1, reorienting the solar arrays in response to a change in a relative position of the sun.

4. The method of claim 1, wherein the frame comprises an elongated beam, and wherein a portion of the inclination linkage assembly is disposed in the beam.

5. The method of claim 1, wherein the azimuth positioning system comprises tubular pedestal pilings that each have an end coupled with the azimuth linkage assembly, and wherein the inclination positioning system comprises elongated shafts that are each coaxially disposed in a one of the tubular pedestal pilings and that each have an end coupled with the inclination linkage assembly.

6. A method of converting solar energy to electricity comprising:
    collecting solar energy with a solar energy collection system that comprises solar arrays mounted on a frame, an azimuth positioning system coupled with the solar arrays, an inclination positioning system coupled with the solar arrays, an azimuth motor coupled with the azimuth positioning system via an azimuth linkage assembly, and an inclination motor coupled with the inclination positioning system via an inclination linkage assembly;
    rotating the arrays about a vertical axis to orient the solar arrays in a designated azimuthal orientation by energizing the azimuth motor so that a force is transmitted to the azimuth positioning system via the azimuth linkage assembly linkage assembly:
    rotating the arrays about a horizontal axis to orient the solar arrays in a designated inclination orientation by energizing the inclination motor so that a force is transmitted to the inclination positioning system via the inclination linkage assembly;
    reflecting solar energy from solar collectors to receivers in the solar arrays that generate electricity in response to exposure to solar energy; and
    wherein the azimuth positioning system comprises tubular pedestal pilings that each has an end coupled with the azimuth linkage assembly, and wherein the inclination positioning system comprises elongated shafts that are each coaxially disposed in a one of the tubular pedestal pilings and that each has an end coupled with the inclination linkage assembly.

7. The method of claim 6, wherein the designated orientation is an orientation that the solar collectors receive a maximum amount of solar energy.

8. The method of claim 6, reorienting the solar arrays in response to a change in a relative position of the sun.

9. The method of claim 6, wherein the frame comprises an elongated beam, and wherein a portion of the inclination linkage assembly is disposed in the beam.

10. The method of claim 6, wherein the azimuth and inclination linkage assemblies each comprise belts, and wherein the motors provide a rotational force to the belts that drive the azimuth and inclination positioning systems.

* * * * *